United States Patent
Moseley

(10) Patent No.: US 10,797,697 B2
(45) Date of Patent: Oct. 6, 2020

(54) PHASE RELATIONSHIP SENSING SYSTEM

(71) Applicant: Tactual Labs Co., New York, NY (US)

(72) Inventor: Braon Moseley, Round Rock, TX (US)

(73) Assignee: Tactual Labs Co., New York, NY (US)

(*) Notice: Subject to any disclaimer, the term of this patent is extended or adjusted under 35 U.S.C. 154(b) by 0 days.

(21) Appl. No.: 16/268,153

(22) Filed: Feb. 5, 2019

(65) Prior Publication Data

US 2019/0173467 A1 Jun. 6, 2019

Related U.S. Application Data

(63) Continuation-in-part of application No. 15/905,465, filed on Feb. 26, 2018.

(60) Provisional application No. 62/572,005, filed on Oct. 13, 2017, provisional application No. 62/540,458, filed on Aug. 2, 2017, provisional application No. 62/771,871, filed on Nov. 27, 2018.

(51) Int. Cl.
| | |
|---|---|
| G06F 3/01 | (2006.01) |
| G06F 3/044 | (2006.01) |
| H03K 17/96 | (2006.01) |
| G06F 3/041 | (2006.01) |

(52) U.S. Cl.
CPC ........... *H03K 17/962* (2013.01); *G06F 3/017* (2013.01); *G06F 3/044* (2013.01); *G06F 3/0416* (2013.01); *H03K 2017/9613* (2013.01); *H03K 2217/96071* (2013.01)

(58) Field of Classification Search
None
See application file for complete search history.

(56) References Cited

U.S. PATENT DOCUMENTS

| | | | |
|---|---|---|---|
| 9,285,902 B1* | 3/2016 | Kremin | G06F 3/044 |
| 2005/0110771 A1* | 5/2005 | Hall | G06F 3/0416 345/173 |
| 2009/0127005 A1* | 5/2009 | Zachut | G06F 3/0418 178/18.03 |
| 2010/0059295 A1* | 3/2010 | Hotelling | G06F 3/0416 178/18.06 |
| 2010/0155153 A1* | 6/2010 | Zachut | G06F 3/03545 178/18.03 |
| 2012/0013565 A1* | 1/2012 | Westhues | G06F 3/0418 345/174 |
| 2012/0056841 A1* | 3/2012 | Krenik | G06F 3/0418 345/174 |
| 2012/0154340 A1* | 6/2012 | Vuppu | G06F 3/03545 345/179 |
| 2013/0057503 A1* | 3/2013 | Hristov | G06F 3/044 345/174 |
| 2014/0198053 A1* | 7/2014 | Yoon | G06F 3/0416 345/173 |

(Continued)

*Primary Examiner* — Kent W Chang
*Assistant Examiner* — Benjamin Morales
(74) *Attorney, Agent, or Firm* — Adam B. Landa

(57) ABSTRACT

A person or object is infused with a signal. The infused signal has a phase relationship with the signals that are transmitted from and used by a touch sensor, controller or wearable. The phase relationship of the infused signal is used in order to increase the ability of receivers at or on the touch sensor, controller or wearable to measure and determine touch events, such as hover.

18 Claims, 3 Drawing Sheets

(56) References Cited

U.S. PATENT DOCUMENTS

| | | | | |
|---|---|---|---|---|
| 2014/0327644 A1* | 11/2014 | Mohindra | ............... | G06F 3/044 345/174 |
| 2015/0109212 A1* | 4/2015 | Yao | ........................ | G06F 3/044 345/173 |
| 2015/0169108 A1* | 6/2015 | Ishii | ..................... | G06F 3/0418 345/174 |
| 2015/0199046 A1* | 7/2015 | Olson | .................... | G06F 3/044 345/174 |
| 2015/0301644 A1* | 10/2015 | Walley | ................... | G06F 1/163 345/174 |
| 2015/0302554 A1* | 10/2015 | Costa | .................... | G06F 3/041 345/174 |
| 2016/0188085 A1* | 6/2016 | Leigh | ................... | G06F 3/0416 345/174 |
| 2017/0228062 A1* | 8/2017 | Hristov | .................. | G06F 3/044 |
| 2017/0315662 A1* | 11/2017 | Reynolds | .............. | G06F 3/0414 |
| 2017/0364184 A1* | 12/2017 | Weinerth | .............. | G06F 3/0416 |
| 2019/0146602 A1* | 5/2019 | Kadowaki | ............ | G06F 3/0383 345/174 |

* cited by examiner

PHASE RELATIONSHIP SENSING SYSTEM

This application claims the benefit of U.S. Provisional Application Ser. No. 62/771,871 filed Nov. 27, 2018, the contents of which are hereby incorporated herein by reference; this application is also a continuation in part of U.S. Pat. No. 15/905,465, entitled "Phase Shift and Phase Shift Assisted Sensing" filed Feb. 26, 2018, which claims the benefit of U.S. Provisional Patent Application Ser. No. 62/540,458, entitled "Noise Mitigation for Frequency Domain Sensor," filed Aug. 2, 2017; and U.S. Provisional Patent Application Ser. No. 62/572,005, entitled "High Proximity Minimal Transmit Sensor Driver," filed Oct. 13, 2017, the contents of all the aforementioned applications hereby incorporated herein by reference.

FIELD

Disclosed systems relate in general to the field of sensors, and in particular to sensors using a phase relationship of transmitted signals.

BRIEF DESCRIPTION OF THE DRAWINGS

The foregoing and other objects, features, and advantages of the disclosure will be apparent from the following more particular description of embodiments as illustrated in the accompanying drawings, in which reference characters refer to the same parts throughout the various views. The drawings are not necessarily to scale, emphasis instead being placed upon illustrating principles of the disclosed embodiments.

DETAILED DESCRIPTION

Figure 1:
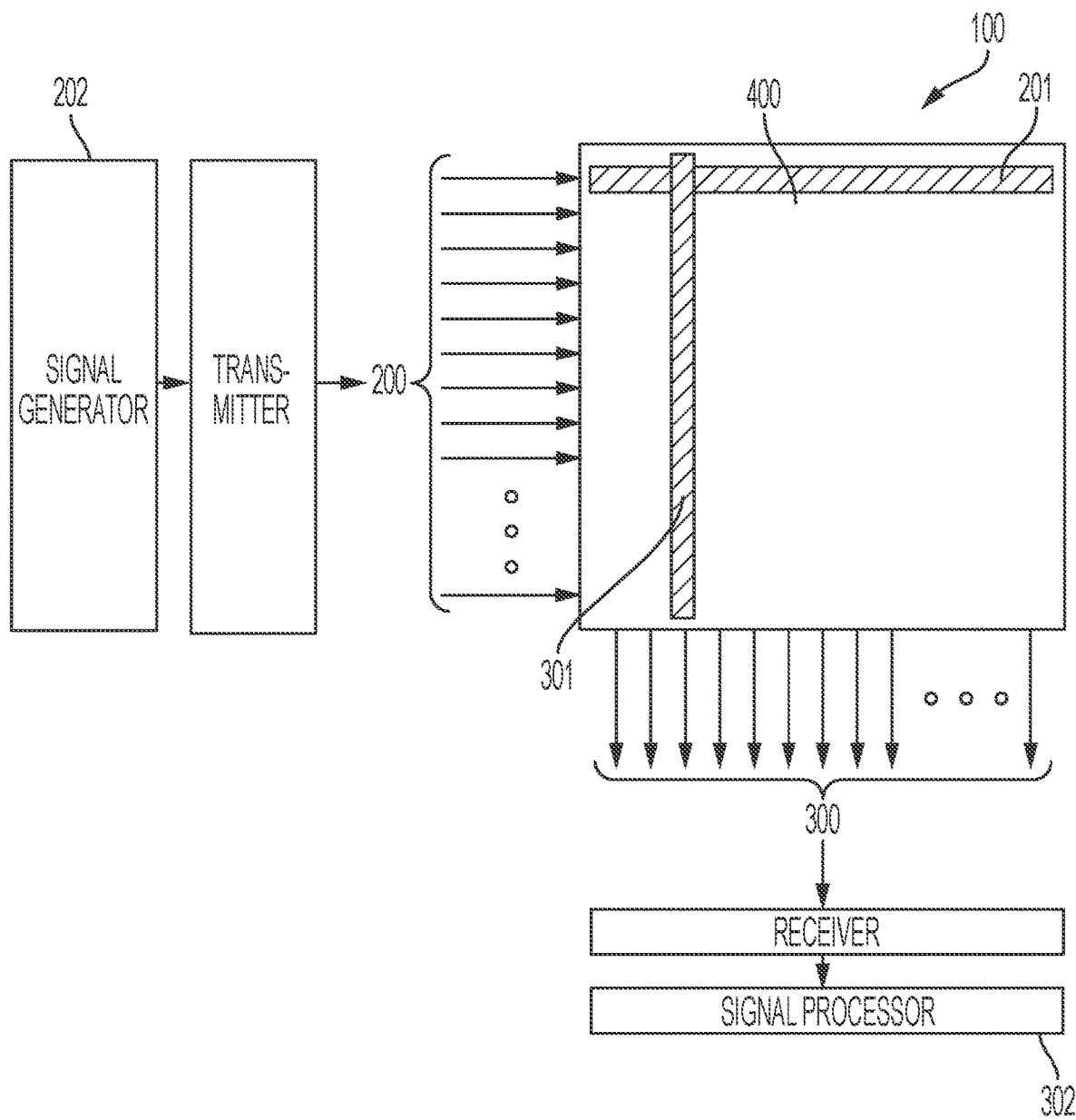
FIG. 1 is a schematic of a sensor used for the detection of touch.

In various embodiments, the present disclosure is directed to systems (e.g., objects, wearables, panels, keyboards) sensitive to hover, contact and pressure and their applications in real-world, artificial reality, virtual reality and augmented reality settings. It will be understood by one of ordinary skill in the art that the disclosures herein apply generally to all types of systems using fast multi-touch to detect hover, contact and pressure. In an embodiment, the present system and method can be applied to panels and display surfaces, including but not limited to smart boards, touch pads, smart pads and interactive displays.

Throughout this disclosure, the terms "touch", "touches", "touch event", "contact", "contacts", "hover", or "hovers" or other descriptors may be used to describe events or periods of time in which a key, key switch, user's finger, a stylus, an object, or a body part is detected by a sensor. In some sensors, detections occur only when the user is in physical contact with a sensor, or a device in which it is embodied. In some embodiments, and as generally denoted by the word "contact", these detections occur as a result of physical contact with a sensor, or a device in which it is embodied. In other embodiments, and as sometimes generally referred to by the term "hover", the sensor may be tuned to allow for the detection of "touches" that are hovering at a distance above the touch surface or otherwise separated from the sensor device and causes a recognizable change, despite the fact that the conductive or capacitive object, e.g., a stylus or pen, is not in actual physical contact with the surface. Therefore, the use of language within this description that implies reliance upon sensed physical contact should not be taken to mean that the techniques described apply only to those embodiments; indeed, nearly all, if not all, of what is described herein would apply equally to "contact" and "hover", each of which is a "touch". Generally, as used herein, the word "hover" refers to non-contact touch events or touch, and as used herein the term "hover" is one type of "touch" in the sense that "touch" is intended herein. Thus, as used herein, the phrase "touch event" and the word "touch" when used as a noun include a near touch and a near touch event, or any other gesture that can be identified using a sensor. "Pressure" refers to the force per unit area exerted by a user contact (e.g., presses by their fingers or hand) against the surface of an object. The amount of "pressure" is similarly a measure of "contact", i.e., "touch". "Touch" refers to the states of "hover", "contact", "pressure", or "grip", whereas a lack of "touch" is generally identified by signals being below a threshold for accurate measurement by the sensor. In accordance with an embodiment, touch events may be detected, processed, and supplied to downstream computational processes with very low latency, e.g., on the order of ten milliseconds or less, or on the order of less than one millisecond.

As used herein, and especially within the claims, ordinal terms such as first and second are not intended, in and of themselves, to imply sequence, time or uniqueness, but rather, are used to distinguish one claimed construct from another. In some uses where the context dictates, these terms may imply that the first and second are unique. For example, where an event occurs at a first time, and another event occurs at a second time, there is no intended implication that the first time occurs before the second time, after the second time or simultaneously with the second time. However, where the further limitation that the second time is after the first time is presented in the claim, the context would require reading the first time and the second time to be unique times. Similarly, where the context so dictates or permits, ordinal terms are intended to be broadly construed so that the two identified claim constructs can be of the same characteristic or of different characteristic. Thus, for example, a first and a second frequency, absent further limitation, could be the same frequency, e.g., the first frequency being 10 Mhz and the second frequency being 10 Mhz; or could be different frequencies, e.g., the first frequency being 10 Mhz and the second frequency being 11 Mhz. Context may dictate otherwise, for example, where a first and a second frequency are further limited to being frequency-orthogonal to each other, in which case, they could not be the same frequency.

The present application contemplates various embodiments of sensors designed for implementation in devices such as touch panels, controllers, objects, interfaces, wearables, etc. The sensor configurations are suited for use with frequency-orthogonal signaling techniques (for further discussion see, e.g., U.S. Pat. Nos. 9,019,224 and 9,529,476, and U.S. Pat. No. 9,811,214, all of which are hereby incorporated herein by reference). The sensor configurations discussed herein may be used with other signal techniques including scanning or time division techniques, and/or code division techniques. It is pertinent to note that the sensors described and illustrated herein are also suitable for use in connection with signal infusion (also referred to as signal injection) techniques and apparatuses.

The presently disclosed systems and methods involve principles related to and for designing, manufacturing and using sensors, and such as capacitive based sensors that employ a multiplexing scheme based on orthogonal signaling such as but not limited to frequency-division multiplexing (FDM), code-division multiplexing (CDM), or a hybrid modulation technique that combines both FDM and CDM methods. References to frequency herein could also refer to other orthogonal signal bases. As such, this application incorporates herein by reference Applicants' prior U.S. Pat. No. 9,019,224, entitled "Low-Latency Touch Sensitive Device" and U.S. Pat. No. 9,158,411 entitled "Fast Multi-Touch Post Processing." These applications contemplate FDM, CDM, or FDM/CDM hybrid touch sensors which may be used in connection with the presently disclosed sensors. In such sensors, interactions are sensed when a signal from a row is coupled (increased) or decoupled (decreased) to a column and the result received on that column. By sequentially exciting the rows and measuring the coupling of the excitation signal at the columns, a heatmap reflecting capacitance changes, and thus proximity, can be created.

This application also employs principles used in fast multi-touch sensors and other interfaces disclosed in the following: U.S. Pat. Nos. 9,933,880; 9,019,224; 9,811,214; 9,804,721; 9,710,113; and 9,158,411. Familiarity with the disclosure, concepts and nomenclature within these patents is presumed. The entire disclosure of those patents and the applications incorporated therein by reference are incorporated herein by reference. This application also employs principles used in fast multi-touch sensors and other interfaces disclosed in the following: U.S. patent application Ser. Nos. 15/162,240; 15/690,234; 15/195,675; 15/200,642; 15/821,677; 15/904,953; 15/905,465; 15/943,221; 62/540,458, 62/575,005, 62/621,117, 62/619,656 and PCT publication PCT/US2017/050547, familiarity with the disclosures, concepts and nomenclature therein is presumed. The entire disclosure of those applications and the applications incorporated therein by reference are incorporated herein by reference.

Certain principles of a fast multi-touch (FMT) sensor have been disclosed in patent applications discussed above. Orthogonal signals are transmitted into a plurality of transmitting conductors (or antennas) and the information received by receivers attached to a plurality of receiving conductors (or antennas), the signal is then analyzed by a signal processor to identify touch events. The terms "conductor" and "antenna" are used herein interchangeably. The transmitting conductors and receiving conductors may be organized in a variety of configurations, including, e.g., a matrix where the crossing points form nodes, and interactions are detected at those nodes by processing of the received signals. In an embodiment where the orthogonal signals are frequency orthogonal, spacing between the orthogonal frequencies, $\Delta f$, is at least the reciprocal of the measurement period $\tau$, the measurement period $\tau$ being equal to the period during which the columns are sampled. Thus, in an embodiment, a column may be measured for one millisecond ($\tau$) using frequency spacing ($\Delta f$) of one kilohertz (i.e., $\Delta f=1/\tau$).

In an embodiment, the signal processor of a mixed signal integrated circuit (or a downstream component or software) is adapted to determine at least one value representing each frequency orthogonal signal transmitted to a row. In an embodiment, the signal processor of the mixed signal integrated circuit (or a downstream component or software) performs a Fourier transform to received signals. In an embodiment, the mixed signal integrated circuit is adapted to digitize received signals. In an embodiment, the mixed signal integrated circuit (or a downstream component or software) is adapted to digitize received signals and perform a discrete Fourier transform (DFT) on the digitized information. In an embodiment, the mixed signal integrated circuit (or a downstream component or software) is adapted to digitize received signals and perform a Fast Fourier transform (FFT) on the digitized information—an FFT being one type of discrete Fourier transform.

It will be apparent to a person of skill in the art in view of this disclosure that a DFT, in essence, treats the sequence of digital samples (e.g., window) taken during a sampling period (e.g., integration period) as though it repeats. As a consequence, signals that are not center frequencies (i.e., not integer multiples of the reciprocal of the integration period (which reciprocal defines the minimum frequency spacing)), may have relatively nominal, but unintended consequence of contributing small values into other DFT bins. Thus, it will also be apparent to a person of skill in the art in view of this disclosure that, the term orthogonal as used herein is not "violated" by such small contributions. In other words, as we use the term frequency orthogonal herein, two signals are considered frequency orthogonal if substantially all of the contribution of one signal to the DFT bins is made to different DFT bins than substantially all of the contribution of the other signal.

In an embodiment, received signals are sampled at at least 1 MHz. In an embodiment, received signals are sampled at at least 2 MHz. In an embodiment, received signals are sampled at 4 Mhz. In an embodiment, received signals are sampled at 4.096 Mhz. In an embodiment, received signals are sampled at more than 4 MHz.

To achieve kHz sampling, for example, 4096 samples may be taken at 4.096 MHz. In such an embodiment, the integration period is 1 millisecond, which per the constraint that the frequency spacing should be greater than or equal to the reciprocal of the integration period provides a minimum frequency spacing of 1 KHz. (It will be apparent to one of skill in the art in view of this disclosure that taking 4096 samples at e.g., 4 MHz would yield an integration period slightly longer than a millisecond, and not achieving kHz sampling, and a minimum frequency spacing of 976.5625 Hz.) In an embodiment, the frequency spacing is equal to the reciprocal of the integration period. In such an embodiment, the maximum frequency of a frequency-orthogonal signal range should be less than 2 MHz. In such an embodiment, the practical maximum frequency of a frequency-orthogonal signal range should be less than about 40% of the sampling rate, or about 1.6 MHz. In an embodiment, a DFT (which could be an FFT) is used to transform the digitized received signals into bins of information, each reflecting the frequency of a frequency-orthogonal signal transmitted which may have been transmitted by the transmit antenna 130. In an embodiment 2048 bins correspond to frequencies from 1 KHz to about 2 MHz. It will be apparent to a person of skill in the art in view of this disclosure that these examples are simply that, exemplary. Depending on the needs of a system, and subject to the constraints described above, the sample rate may be increased or decreased, the integration period may be adjusted, the frequency range may be adjusted, etc.

In an embodiment, a DFT (which can be an FFT) output comprises a bin for each frequency-orthogonal signal that is transmitted. In an embodiment, each DFT (which can be an FFT) bin comprises an in-phase (I) and quadrature (Q) component. In an embodiment, the sum of the squares of the I and Q components is used as measure corresponding to signal strength for that bin. In an embodiment, the square root of the sum of the squares of the I and Q components is used as a measure corresponding to signal strength for that bin. It will be apparent to a person of skill in the art in view of this disclosure that a measure corresponding to the signal strength for a bin could be used as a measure related to biometric activity. In other words, the measure corresponding to signal strength in a given bin would change as a result of some activity.

FIG. 1 illustrates certain principles of a fast multi-touch sensor 100 in accordance with an embodiment. Transmitter 200 transmits a different signal, generated by signal generator 202, into each of the row conductors 201 of the panel 400. The signals are designed to be "orthogonal", i.e., separable and distinguishable from each other. A receiver 300 is attached to each column conductor 301 and has operatively connected thereto a signal processor 302. The row conductors 201 and the column conductors 301 are conductors/antennas that are able to transmit and/or receive signals. The receiver 300 is designed to receive any of the transmitted signals, or an arbitrary combination of them, with or without other signals and/or noise, and to individually determine a measure, e.g., a quantity for each of the orthogonal transmitted signals present on that column conductor 301. The touch panel 400 comprises a series of row conductors 201 and column conductors 301 (not all shown), along which the orthogonal signals can propagate. In an embodiment, the row conductors 201 and column conductors 301 are arranged such that a touch event will cause a change in coupling between at least one of the row conductors 201 and at least one of the column conductors 301. In an embodiment, a touch event will cause a change in the amount (e.g., magnitude) of a signal transmitted on a row conductor 201 that is detected in the column conductor 301. In an embodiment, a touch event will cause a change in the phase of a signal transmitted on a row conductor 201 that is detected on a column conductor 301. Because the sensor 100 ultimately detects a touch event due to a change in the coupling, it is not of specific importance, except for reasons that may otherwise be apparent to a particular embodiment, the type of change that is caused to the touch-related coupling by a touch. As discussed above, the touch, or touch event does not require a physical touching, but rather an event that affects the coupled signal. In an embodiment the touch or touch event does not require a physical touching, but rather an event that affects the coupled signal in a repeatable or predictable manner.

With continued reference to FIG. 1, in an embodiment, generally, the result of a touch event in the proximity of both a row conductor 201 and column conductor 301 causes a change in the signal that is transmitted on a row conductor 201 as it is detected on a column conductor 301. In an embodiment, the change in coupling may be detected by comparing successive measurements on the column conductor 301. In an embodiment, the change in coupling may be detected by comparing the characteristics of the signal transmitted on the row conductor 201 to a measurement made on the column conductor 301. In an embodiment, a change in coupling may be measured both by comparing successive measurements on the column conductor 301 and by comparing known characteristics of the signal transmitted on the row conductor 201 to a measurement made on the column conductor 301. More generally, touch events cause, and thus correspond to, measurements of the signals on the column conductors 301. Because the signals on the row conductors 201 are orthogonal, multiple row signals can be coupled to a column conductor 301 and distinguished by the receiver 300. Likewise, the signals on each row conductor 201 can be coupled to multiple column conductors 301. For each column conductor 301 coupled to a given row conductor 201 (and regardless of how touch affects the coupling between the row and column conductors), the signals measured on the column conductor 301 contain information that will indicate which row conductors 201 are being touched simultaneously with that column conductor 301. The magnitude or phase shift of each signal received is generally related to the amount of coupling between the column conductor 301 and the row conductor 201 carrying the corresponding signal, and thus, may indicate a distance of the touching object to the surface, an area of the surface covered by the touch and/or the pressure of the touch.

In various implementations of a touch device, physical contact with the row conductor 201 and/or column conductor 301 is unlikely or impossible as there may be a protective barrier between the row conductors 201 and/or column conductors 301 and the finger or other object of touch. Moreover, generally, the row conductors 201 and column conductors 301 themselves are not in physical contact with each other, but rather, placed in a proximity that allows signal to be coupled there-between, and that coupling changes with touch. Generally, the row-column coupling results not from actual contact between them, nor by actual contact from the finger or other object of touch, but rather, by the effect of bringing the finger (or other object) into proximity—which proximity results in a change of coupling, which effect is referred to herein as touch.

In an embodiment, the orientation of the row conductors 201 and column conductors 301 may vary as a consequence of a physical process, and the change in the orientation (e.g., movement) of the row conductors 201 and/or column conductors 301 with respect to one-another may cause a change in coupling. In an embodiment, the orientation of a row conductor 201 and a column conductor 301 may vary as a consequence of a physical process, and the range of orientation between the row conductor 201 and column conductor 301 include ohmic contact, thus in some orientations within a range a row conductor 201 and column conductor 301 may be in physical contact, while in other orientations within the range, the row conductor 201 and column conductor 301 are not in physical contact and may have their coupling varied. In an embodiment, when a row conductor 201 and column conductor 301 are not in physical contact their coupling may be varied as a consequence of moving closer together or further apart. In an embodiment, when a row conductor 201 and column conductor 301 are not in physical contact their coupling may be varied as a consequence of grounding. In an embodiment, when a row conductor 201 and column conductor 301 are not in physical contact their coupling may be varied as a consequence of materials translated within the coupled field. In an embodiment, when a row conductor 201 and column conductor 301 are not in physical contact their coupling may be varied as a consequence of a changing shape of the row conductor 201 or column conductor 301, or an antenna associated with the row or column conductors.

The nature of the row conductors 201 and column conductors 301 is arbitrary and the particular orientation is variable. Indeed, the terms row conductor and column conductor are not intended to refer to a square grid, but rather to a set of conductors upon which signal is transmitted (row conductors) and a set of conductors onto which signal may be coupled (column conductors). The notion that signals are transmitted on row conductors and received on column conductors itself is arbitrary, and signals could as easily be transmitted on conductors arbitrarily designated columns and received on conductors arbitrarily named row conductors, or both could arbitrarily be named something else. Further, it is not necessary that row conductors and column conductors be in a grid. Other shapes are possible as long as a touch event will affect a row-column coupling. For example, the "rows" could be in concentric circles and the "columns" could be spokes radiating out from the center. And neither the "rows" nor the "columns" need to follow any geometric or spatial pattern, thus, for example, the keys on a keyboard could be arbitrarily connected to form rows and columns (related or unrelated to their relative positions). Moreover, the physical structure of a conductor or antenna may change depending on a row conductor (e.g., having a more defined shape than a simple conducting wire such as for example a row made from ITO). For example an antenna or conductor may be round or rectangular, or have substantially any shape, or a shape that changes. An antenna (or conductor) used as a row may be oriented in proximity to one or more conductors, or one or more other antennas that act as columns. In other words, in an embodiment, an antenna may be used for signal transmission and oriented in proximity to one or more conductors, or one or more other antennas that are used to receive signals. A touch will change the coupling between the antenna used for signal transmission and the signal used to receive signals.

It is not necessary for there to be only two types signal propagation channels: instead of row conductors and column conductors, in an embodiment, channels "A", "B" and "C" may be provided, where signals transmitted on "A" could be received on "B" and "C", or, in an embodiment, signals transmitted on "A" and "B" could be received on "C". It is also possible that the signal propagation channels can alternate function, sometimes supporting transmitters and sometimes supporting receivers. It is also contemplated that the signal propagation channels can simultaneously support transmitters and receivers—provided that the signals transmitted are orthogonal, and thus separable, from the signals received. Three or more types of antenna or conductors may be used rather than just "rows" and "columns." Many alternative embodiments are possible and will be apparent to a person of skill in the art after considering this disclosure.

It is likewise not necessary for there to be only one signal transmitted on each transmitting media. In an embodiment, multiple orthogonal signals are transmitted on each row conductor. In an embodiment, multiple orthogonal signals are transmitted on each transmit antenna.

Returning to FIG. 1, as noted above, in an embodiment the panel 400, which is a touch panel, comprises a series of row conductors 201 and column conductors 301, along which signals can propagate. As discussed above, the row conductors 201 and column conductors 301 are oriented so that, when they are not being touched the signals are coupled differently than when they are being touched. The change in signal coupled between them may be generally proportional or inversely proportional (although not necessarily linearly proportional) to the touch such that touch is measured as a gradation, permitting distinction between more touch (i.e., closer or firmer) and less touch (i.e., farther or softer)—and even no touch.

A receiver 300 is attached to each column conductor 301, which has a signal processor 302 operatively connected thereto. The receiver 300 is designed to receive the signals present on the column conductors 301, including any of the orthogonal signals, or an arbitrary combination of the orthogonal signals, and any noise or other signals present. Generally, the receiver is designed to receive a frame of signals present on the column conductors 301, and to identify the columns providing signal. A frame of signals is received during an integration period or sampling period. In an embodiment, the signal processor 302 associated with the receiver data may determine a measure associated with the quantity of each of the orthogonal transmitted signals present on that column conductor 301 during the time the frame of signals was captured. In this manner, in addition to identifying the row conductors 201 in touch with each column conductor 301, the receiver can provide additional (e.g., qualitative) information concerning the touch. In general, touch events may correspond (or inversely correspond) to the received signals on the column conductors 301. For each column conductor 301, the different signals received thereon indicate which of the corresponding row conductors 201 is being touched simultaneously with that column conductor 301. In an embodiment, the amount of coupling between the corresponding row conductor 201 and column conductor 301 may indicate, e.g., the area of the surface covered by the touch, the pressure of the touch, etc. In an embodiment, a change in coupling over time between the corresponding row conductor 201 and column conductor 301 indicates a change in touch at the intersection of the two.

In an embodiment, a mixed signal integrated circuit comprises signal generator, transmitter, receiver and signal processor. In an embodiment, the mixed signal integrated circuit is adapted to generate one or more signals and send the signals to transmit antennas. In an embodiment, the mixed signal integrated circuit is adapted to generate a plurality of frequency-orthogonal signals and send the plurality of frequency-orthogonal signals to the transmit antenna. In an embodiment, the mixed signal integrated circuit is adapted to generate a plurality of frequency-orthogonal signals and send one or more of the plurality of frequency-orthogonal signals to each of a plurality of rows. In an embodiment, the frequency-orthogonal signals are in the range from DC up to about 2.5 GHz. In an embodiment, the frequency-orthogonal signals are in the range from DC up to about 1.6 MHz. In an embodiment, the frequency-orthogonal signals are in the range from 50 KHz to 200 KHz. The frequency spacing between the frequency-orthogonal signals should be greater than or equal to the reciprocal of an integration period (i.e., the sampling period).

When dealing with a touch panel 400 many factors come into play that governs the detection of signals and consequently touch events. The crosstalk between row conductors 201 and column conductors 301 plays a role in determining touch events. The coupling magnitude and the phase in any region of the touch panel 400 can also play a role in determining the touch events. For example, the nature of the conductor used for the row conductors 201 and column conductors 301 can play a factor in determination of touch events. The mutual capacitance in the near field between a row conductor 201 and another row conductor 201 can play a factor in the determination of touch events. The mutual capacitance between a row conductor 201 and another column conductor 301 can play a factor in the determination of touch events. The mutual capacitance between a column conductor 301 and another column conductor 301 can play a factor in the determination of touch events. The mutual inductance in the near field between a row conductor 201 and another row conductor 201 can play a factor in the determination of touch events. The mutual inductance between a row conductor 201 and another column conductor 301 can play a factor in the determination of touch events. The mutual inductance between a column conductor 301 and another column conductor 301 can play a factor in the determination of touch events. The dielectric and permeability characteristics of the materials between, on, and near the row conductor 201 and column conductor 301 additionally can play a factor in the determination of touch events.

The signal processor 302 is able to analyze the received signals and detect small changes in the crosstalk/coupling. At each sensed row/column coupling that is greater than the absolute magnitude of a driven frequency or frequencies can be detected and analyzed by the signal processor 302. The real component of the received signal of a driven frequency or frequencies can be detected and analyzed by the signal processor 302. The imaginary component of the received signal of a driven frequency or frequencies can be detected and analyzed by the processor 302. The phase relationship with respect to the real and imaginary components of a driven frequency or frequencies of the coupled signal can increase, decrease, or stay the same with respect to each OFD separable frequency. These changes can be detected and analyzed by the signal processor 302.

The detectable changes in received signal components for coupling are repeated for every unique sensed row/column coupling for the entire sensor 100. Mathematical comparisons can then be made between any two or more sensed row/column coupling, amongst any region or neighborhood of nearby sensed row/column coupling, and/or amongst any two or more such regions.

The information space for a single sensed row/column coupling is quite dense, and therefore the permutation of information space amongst one sensed row/column coupling or region with respect to another unique and separate sensed row column coupling or region is quite large. Any change in the relationship of the factors establishing one or more signal properties at a given sensed row/column coupling is detectable.

In addition to the detection of touch events on a touch sensor due to the detection of interaction between conductors, as described above, it has also been discovered that it is possible to infuse a signal into a person or conductive object and that the infused signal will impact a sensor in proximity to the infused person or object. In U.S. patent application Ser. No. 16/193,476, entitled "System and Methods for Infusion Range Sensor," incorporated herein by reference, a method and system for measuring the distance of infused object from a sensor was discussed. In that application, a body part or an object was infused with a signal and moved with respect to a sensor. Though the movement of the infused body part or object, the system was able to determine measurements based on the received signals and determine a position of the body part or object from the sensor.

Building off the insights learned from the aforementioned disclosure regarding determining the position of a person or object infused with a signal, further uses of infusion were explored. A person or object that has the signal infused therein can impact the sensor and what the receivers on the sensor detect and measure. In an embodiment, an infused signal is frequency orthogonal with respect to the other signals used by (e.g., transmitted across) the touch sensor. In an embodiment the infused signal is that same frequency as another signal transmitted on the touch panel. In an embodiment the infused signal has the same frequency as another signal on the sensor, however, has a predetermined phase relationship with respect to the signals having the same frequency.

It has further been determined that additional information can be obtained from the system based upon the phase relationship of certain transmitted signals. The phase relationship of the certain transmitted signals will impact the receipt of the transmitted signals at the receivers. The receipt of the transmitted signals will impact what is measured and determined on a system such as a touch panel or other senor. In addition to being able to detect a measurement of the infused signal on the touch panel, it is also possible to use the phase characteristics of the infused signals in order to detect or better determine touch events, such as a hover, in certain scenarios, using the phase relationship of the transmitted and infused signals. In particular, the phase relationship of the infused signals with respect to the signals that are transmitted on the touch panel can be used to impact the detection of touch events, such as hover. In an embodiment, the phase relationship of the infused signals with the signals that are transmitted on the touch panel can increase hover detection of the touch panel. In an embodiment, the phase relationship of the infused signals with the signals that are transmitted on the touch sensor can be used to develop a better heatmap for e.g., determining the position of a body part. In an embodiment, the phase relationship of the infused signals with the signals that are transmitted on the touch panel can be used to improve the signal to noise ratio when determining the position of a body part.

In an embodiment, a touch sensing system is configured having a sensor made up of at least two antennas or conductors, one being used for transmitting and the other for receiving. More antennas or conductors can be added to increase resolution and/or sensitivity. A TX signal generation circuit is configured to produce a signal that is operatively connected to a conductor or antenna, and thus transmits the signal. The same signal is also coupled to a phase changing circuit that outputs a changed signal, the changed signal differing by a phase angle (e.g., 90 degrees or 180 degrees) from the source signal. The changed phase signal is operatively coupled to the body (e.g. a signal infuser is operably connected with the body) in proximity to the sensor. A RX and processing circuit is configured to receive signals incident on another conductor or antenna (i.e., not the one used to transmit the signal) during a period of time that the conductor or antenna used to transmit the signal is transmitting. The received signal is processed, e.g., as described above, to make one or more measurements corresponding to the transmitted signal during the period of time. The simultaneous receive and transmit are repeated as appropriate to the application, at e.g., 100 Hz, 500 Hz, 1 MHz. In an embodiment, the foregoing novel configuration increases heat map deformation. In an embodiment, the foregoing novel configuration increases the signal levels in the sensor. In an embodiment, the foregoing novel configuration increases the signal to noise ratio in the received signal. The phase angle described above may be predetermined (e.g., 90 degrees or 180 degrees), may be adjusted once or from time to time, or may be adjusted continuously (e.g., in a feedback loop) to increase the resulting heat map deformation from touches of interest.

Figure 2:
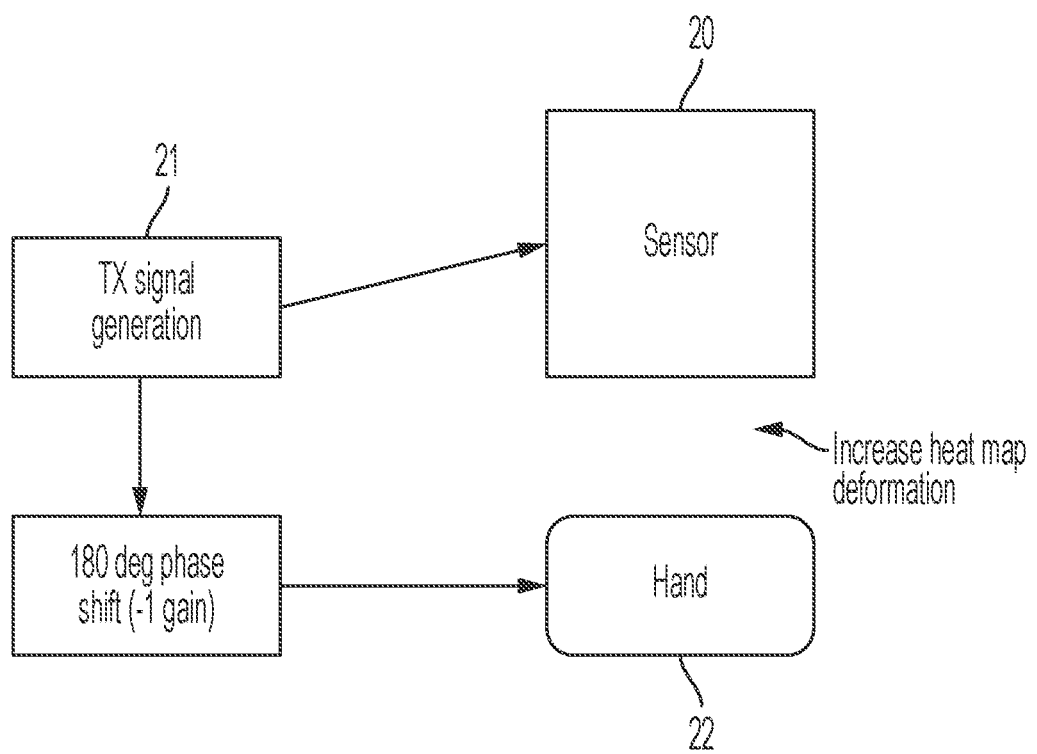
FIG. 2 is a diagram of a phase shifted system using infusion.
Figure 3:
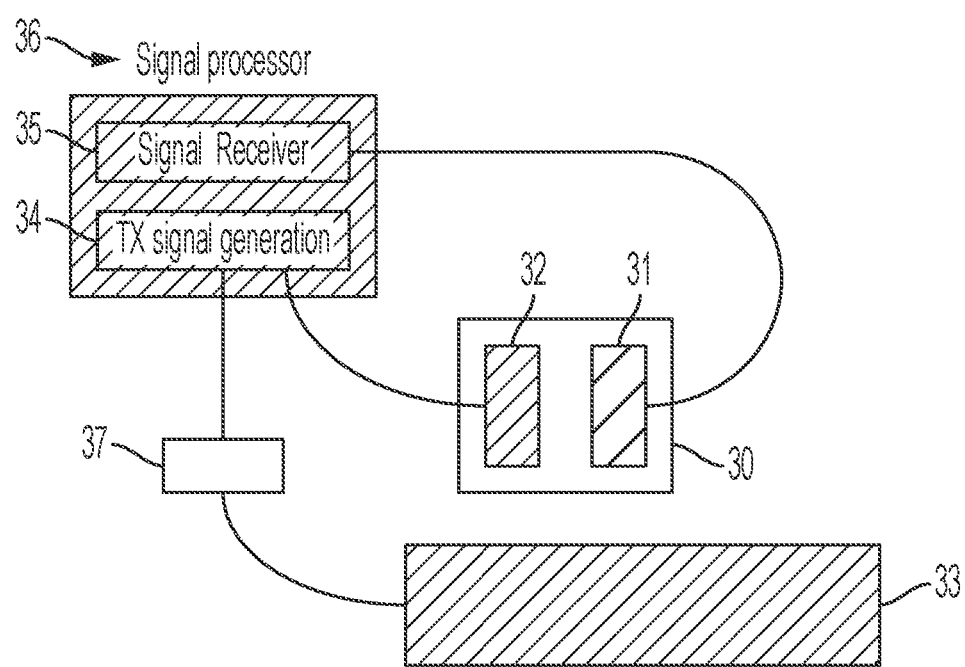
FIG. 3 is another diagram of a phase shifted system using infusion.

FIGS. 2 and 3 show embodiments of systems employing phase shifting of the transmitted signals in order to impact the ability of the system to measure and determine touch events in the system. FIG. 2 shows an embodiment wherein the phase relationship of the infused signal is one in which it is 180 degrees out of phase with respect to the signal that is transmitted on the sensor 20. A signal generator 21 generates a first signal and transmits the first signal to the sensor 20. The same signal (i.e., the same frequency signal) is phase shifted 180 degrees and infused into a hand 22. Having the hand 22 infused with a signal that is phase shifted 180 degrees from the first signal that is on the sensor 20 enables the sensor 20 to measure the presence of the hand 22 at a distance that is further from the surface of the sensor 20. In an embodiment, the same signal generator generates both signals with the predetermined phase relationship. In an embodiment, the signal generated and transmitted to the sensor and the signal generated and infused to the hand are generated by different signal generators wherein each of the signal generators know the phase relationship of each other signal generated.

FIG. 3 shows an embodiment of sensor 30 used in a phase relationship system. The sensor 30 has at least one receiving antenna 31 (or conductor) and at least one transmitting antenna 32 (or conductor). Operably connected to the receiving antenna 31 is a signal receiver 35. Operably connected to the transmitting antenna 32 is a signal generator 34. The signal generator 34 and the signal receiver 35 are operably connected to or integrated with a signal processor 36. An infusion antenna 37 (or electrode) is operably connected to a body part 33. The signal generator 34 generates a signal having a first phase. The generated signal having the first phase is transmitted to the transmitting antenna 32. The same signal (e.g., the same frequency signal) is phase shifted 180 degrees from the signal that is transmitted to the transmitting antenna 32 and is transmitted to the infusion antenna 37. The infusion antenna 37 infuses the phase shifted signal into the body part 33. The phase relationship formed in this example additionally modifies the ability of the sensor 30 to measure interactions that occur near the sensor 30. For example, an object or body part that moves near the sensor 30 is able to be discriminated, i.e. sensed more clearly by the sensor due to the presence of the phase shifted signal infused into the body part 33. The presence of the 180 degree phase shifted signal infused into the body part 33 increases signal strength, which increases the amount of signal with respect to the noise. This impacts the ability of receiving antenna 31 to determine measurements of the signal transmitted at the first phase. In an embodiment, the same signal generator generates both signals with the predetermined phase relationship. In an embodiment, the signal generated and transmitted to the sensor and the signal generated and infused to the hand are generated by different signal generators wherein each of the signal generators know the phase relationship of each other signal generated.

In an embodiment, the phase relationship of the infused signal is one which it is 90 degrees out of phase with respect to the signal that is transmitted on the touch panel. In an embodiment, the phase relationship between the infused signal and the transmitted signal are at a relationship other than 90 degrees or 180 degrees. In an embodiment, the phase relationship is 45 degrees. In an embodiment, the phase relationship is 135 degrees. In an embodiment, the phase relationship is 30 degrees. In an embodiment, the phase relationship is 60 degrees. In an embodiment, the phase relationship is 120 degrees. In an embodiment, the phase relationship is 150 degrees. In an embodiment, the phase relationship is less than 10 degrees. In an embodiment, the phase relationship changes at a known rate, for example in one frame the phase relationship may be 90 degrees and in another frame the phase relationship may be 180 degrees. In an embodiment the phase relationship alternates between 90 degrees and 180 degrees. In an embodiment, the phase relationship changes at a continuous rate.

In addition to touch panels it is possible to have other objects and items covered or layered with conductors or antennas that are able to transmit and receive signals. For example, a controller may be covered with conductors or antennas. In an embodiment, an infusion conductor (electrode) may additionally be located on the controller. The infusion conductor (electrode) is adapted to infuse a signal into a user of the controller. In an embodiment, the infusion conductor is located on an object other than the controller. For example, the infusion conductor may be located on a wearable or piece of jewelry that the user is wearing. If the infusion conductor is located on an object that is separate from the controller or other object that has the conductors, the infusion conductor may additionally be operably connected to the signal generator so as to generate signals that have a predetermined phase relationship with respect to the signals generated and transmitted on the conductors. In an embodiment, the signal generated and transmitted to the sensor and the signal generated and infused to the hand are generated by different signal generators wherein each of the signal generators have a known phase relationship of each other signal generated.

In an embodiment, a signal is transmitted from a controller or wearable from one or more of a plurality of transmitters. The same signal, phase shifted 180 degrees, is infused into a body part. Other phase relationships, such as those discussed above, may also be used. Interaction by a body part or movement of a body part will interact with the transmitted signals. A receiver receives the transmitted signals a measures the signals that are received. The interaction with transmitted signals and thus the measured received signals is used by the system to produce a heat map that is able to be used in determining movement, gesture or position of a body part. The presence of the infused phase shifted signal enables the receiver to measure the signals transmitted from the transmitter and produce heat maps with better resolution than if the infused signal with the phase relationship was not present.

In an embodiment, the motion of a foot is determined by the infused phase relationship system. In an embodiment, the pose of a foot is determined by the infused phase relationship system. In an embodiment, the motion of a leg is determined by the infused phase relationship system. In an embodiment, a pose of hand is determined by the infused phase relationship system. In an embodiment, the motion of a hand is determined by the infused phase relationship system. In an embodiment, a pose of hand is determined by the infused phase relationship system. In an embodiment, the motion of a hand is determined by the infused phase relationship system. In an embodiment, a pose of hand is determined by the infused phase relationship system. In an embodiment, the motion of an arm is determined by the infused phase relationship system. In an embodiment, a pose of arm is determined by the infused phase relationship system. In an embodiment, the motion of a head is determined by the infused phase relationship system. In an embodiment, a pose of head is determined by the infused phase relationship system.

In an addition to controllers, wearables and touch panels, an infused phase relationship system can be employed in vehicles. In a vehicle, components of the vehicle have transmitters and receivers embedded therein or placed thereon. Another component of the vehicle has an infusion electrode or conductor that is able to come into contact with and is adapted to infuse a phase shifted signal into a person that is interacting with the vehicle. The phase shifted signal has a phase relationship with respect to the signals that are transmitted from the transmitters. In an embodiment, the phase relationship of one signal with respect to the other is 180 degrees. Other phase relationships, such as those discussed above, may also be used.

Vehicle based phase relationship systems can be used improve detection and determination of various interactions with the vehicle. In an embodiment, a car seat may have transmitters and receivers embedded. A person may have or interact with an infusion electrode that is able to infuse a signal that has phase relationship with respect to the signals that transmitted from the seat. The approach and position of a person may be better determined by the phase relationship system. In an embodiment, a steering wheel employs a phase relationship system to determine the position of a driver's hands. In an embodiment, the dashboard control systems employ a phase relationship system to better determine a user's hands in relation to the controls of dashboard control systems. In an embodiment, passenger control systems employ a phase relationship system to better determine a user's hands in relation to the passenger control systems. In an embodiment, a key fob has a signal generator that is synced with the transmitters in the vehicle. The key fob can infuse a signal into the person carrying the key fob so that the interactions with door handles, trunks, etc. are better discriminated.

In addition to the infusion base systems discussed above, it is also possible to have objects that in and of themselves are synced with and able to generate signals that have a phase relationship with respect to the transmitted signals that would then provide the same benefits. In an embodiment, a stylus can generate a signal that has a phase relationship with respect to signals transmitted on a touch panel. In an embodiment, a ball or other game piece may generate a signal that has a phase relationship with respect to signals transmitted by transmitters within the environment.

An aspect of the disclosure is a phase relationship system. The phase relationship system comprises a first plurality of antennas operably connected to a signal generator, wherein the signal generator is adapted to generate a plurality of signals, wherein at least one of the plurality of signals is generated having a first phase; a second plurality of antennas operably connected to a receiver, wherein the second plurality of antennas is adapted to receive at least one of the plurality of signals; an infusion electrode operably connected to the signal generator, wherein the infusion electrode is adapted to transmit a signal having a second phase that is in a predetermined phase relationship with respect to the at least one of the plurality of signals having a first phase, wherein the first phase and the second phase are different; and a signal processor adapted to process and determine measurements of received signals.

Another aspect of the disclosure is a method for determining touch events. The method comprises generating a plurality of signals on a first plurality of antennas operably connected to a signal generator, wherein at least one of the plurality of signals is generated having a first phase; receiving at least one of the plurality of signals on at least one of a second plurality of antennas operably connected to a receiver, transmitting an infusion signal via an infusion electrode operably connected to the signal generator, wherein the infusion signal has a second phase that is in a predetermined phase relationship with respect to the at least one of the plurality of signals generated having a first phase, wherein the first phase and the second phase are different; and processing and determining measurements of received signals in order to determine a touch event.

While the invention has been particularly shown and described with reference to a preferred embodiment thereof, it will be understood by those skilled in the art that various changes in form and details may be made therein without departing from the spirit and scope of the invention.

The invention claimed is:

1. A phase relationship system, comprising:
a first plurality of antennas operably connected to a signal generator, wherein the signal generator is adapted to generate a plurality of signals, wherein at least one of the plurality of signals is generated having a first phase;
a second plurality of antennas operably connected to a receiver, wherein the second plurality of antennas is adapted to receive at least one of the plurality of signals;
an infusion electrode operably connected to the signal generator, wherein the infusion electrode is adapted to transmit a signal having a second phase that is in a predetermined phase relationship with respect to the at least one of the plurality of signals having a first phase, wherein the first phase and the second phase are different, wherein the infusion electrode is adapted to be operably connected to a body part and the infusion signal is transmitted into the body part thereby impacting determination of hover for the body part due, at least in part, to the phase relationship between the infusion signal and the at least one of the plurality of signals generated having the first phase; and
a signal processor adapted to process and determine measurements of received signals.

2. The phase relationship system of claim 1, wherein the first phase is 180 degrees different than the second phase.

3. The phase relationship system of claim 1, wherein the first phase is 90 degrees different than the second phase.

4. The phase relationship system of claim 1, wherein the at least one of the plurality of signals having the first phase has a frequency that is the same as the signal having the second phase.

5. The phase relationship system of claim 1, wherein the predetermined phase relationship is adapted to provide a better signal to noise ratio.

6. The phase relationship system of claim 1, wherein the predetermined phase relationship is adapted to impact the detection of touch events.

7. The phase relationship system of claim 1, wherein the predetermined phase relationship changes periodically.

8. The phase relationship system of claim 1, wherein the predetermined phase relationship changes continuously.

9. A method for determining touch events, comprising:
generating a plurality of signals on a first plurality of antennas operably connected to a signal generator, wherein at least one of the plurality of signals is generated having a first phase;
receiving at least one of the plurality of signals on at least one of a second plurality of antennas operably connected to a receiver,
transmitting an infusion signal via an infusion electrode operably connected to the signal generator, wherein the infusion signal has a second phase that is in a predetermined phase relationship with respect to the at least one of the plurality of signals generated having a first phase, wherein the first phase and the second phase are different, wherein the infusion electrode is adapted to be operably connected to a body part and the infusion signal is transmitted into the body part thereby impacting determination of hover for the body part due, at least in part, to the phase relationship between the infusion signal and the at least one of the plurality of signals generated having the first phase; and
processing and determining measurements of received signals in order to determine a touch event.

10. The method of claim 9, wherein the first phase is 180 degrees different than the second phase.

11. The method of claim 9, wherein the first phase is 90 degrees different than the second phase.

12. The method of claim 9, wherein the at least one of the plurality of signals having the first phase has a frequency that is the same as the signal having the second phase.

13. The method of claim 9, wherein the predetermined phase relationship provides a better signal to noise ratio.

14. The method of claim 9, wherein the predetermined phase relationship impacts the detection of touch events.

15. The method of claim 9, wherein the predetermined phase relationship periodically changes.

16. The method of claim 9, wherein the predetermined phase relationship continuously changes.

17. The system of claim 1, wherein determination of hover for another body part not having the infused signal is different than the determination of hover for the body part having the infused signal.

18. The method of claim 9, wherein determination of hover for another body part not having the infused signal is different than the determination of hover for the body part having the infused signal.

\* \* \* \* \*